United States Patent

Dass et al.

Patent Number: 6,143,668
Date of Patent: *Nov. 7, 2000

[54] KLXX TECHNOLOGY WITH INTEGRATED PASSIVATION PROCESS, PROBE GEOMETRY AND PROBING PROCESS

[75] Inventors: M. Lawrence A. Dass, Fremont; Kenneth D. Karklin, Campbell; Krishna Seshan, San Jose; Amir Roggel, Sunnyvale, all of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/941,795

[22] Filed: Sep. 30, 1997

[51] Int. Cl.[7] .................................................. H01L 21/31
[52] U.S. Cl. ............................ 438/763; 438/781; 438/958
[58] Field of Search .............................. 438/18, 613, 763, 438/781, 791, 958

[56] References Cited

U.S. PATENT DOCUMENTS

| 5,013,689 | 5/1991 | Yamamoto | 438/702 |
|---|---|---|---|
| 5,382,898 | 1/1995 | Subramanian . | |
| 5,563,102 | 10/1996 | Michael | 437/209 |
| 5,652,182 | 7/1997 | Cleeves | 438/631 |
| 5,773,987 | 6/1998 | Montoya | 324/757 |
| 5,867,032 | 2/1999 | Montoya | 324/762 |

*Primary Examiner*—Charles Bowers
*Assistant Examiner*—Nema Berezny
*Attorney, Agent, or Firm*—Blakely, Sokoloff, Taylor & Zafman LLP

[57] ABSTRACT

A method of exposing a bond pad includes: providing an integrated circuit having a bond pad, a first passivation layer overlying an area portion of the bond pad, and a second passivation layer overlying the first passivation layer; removing a portion of the second passivation layer above the area portion of the bond pad exposing an area of the first passivation layer; curing the second passivation; and etching a portion of the exposed area of the first passivation layer to expose the top surface of the bond pad. A method of coupling an integrated circuit chip to a chip package is also disclosed as is a method of probing the bond pads of an integrated circuit. A probe card is further disclosed, including a probe assembly coupled to a printed circuit board, the probe assembly having a sloped sidewall portion with a plurality of probing beams extending from the sidewall portion.

15 Claims, 17 Drawing Sheets

KLXX TECHNOLOGY WITH INTEGRATED PASSIVATION PROCESS, PROBE GEOMETRY AND PROBING PROCESS

BACKGROUND OF THE INVENTION

1. Field of the Invention

The invention relates to the field of semiconductor testing and packaging and more particularly to integrated circuit bond pad exposure, packaging, and testing.

2. Description of Related Art

In the manufacture of semiconductor devices, it is advisable that such devices be tested at the wafer level to evaluate their functionality. The process in which die in a wafer are tested is commonly referred to as "wafer sort." Testing and determining design flaws at the die level offers several advantages. First, it allows designers to evaluate the functionality of new devices during development. Increasing packaging costs also make wafer sorting a viable cost saver, in that reliability of each die on a wafer may be tested before incurring the higher costs of packaging. Measuring reliability also allows the performance of the production process to be evaluated and production consistency rated, such as for example by "bin switching" whereby the performance of a wafer is downgraded because that wafer's performance did not meet the expected criteria.

FIG. 1 illustrates a surface view of the top side of an integrated circuit device. Metal interconnect lines and components of integrated circuit device 11 are formed on an underlying silicon substrate. The side of the silicon substrate on which the integrated circuit is formed shall herein be referred to as the top side of the silicon substrate. As illustrated in FIG. 1, bond pads 13 are located along the periphery of integrated circuit device 11. In the center of integrated circuit device 11 is the active region 12 containing the majority of the high density, active circuitry of integrated circuit device 11. To activate the circuitry within active region 12, it is necessary to supply voltage signals to bond pads 13. These voltage signals are supplied to bond pads 13 through a package to which integrated circuit device 11 is affixed.

FIG. 2 illustrates a cross-section of integrated circuit device 11 after packaging. After integrated circuit device 11 is affixed to package substrate 15, individual bond wires 14 are used to electrically couple each bond pad 13 to a corresponding pad on package substrate 15. Each corresponding pad 13 on package substrate 15 is then individually coupled to an external pin 16. The packaged integrated circuit device of FIG. 2 may then be placed within a socket in order to electrically couple external pin 16 to drivers that supply the necessary voltage signal to activate integrated circuit device 11. As illustrated in FIG. 2, integrated circuit device 11 is mounted to package substrate 15 with its top-side facing away from package substrate 15. In this manner, once integrated circuit device 11 is activated through package pin 16, the internal, active region 12 may be accessed and probed for testing since neither bond pads 13, package substrate 15, nor bond wires 14 obscure access to this region of integrated circuit device 11.

FIG. 3 illustrates a top-side view of a second bond pad configuration on an integrated circuit device. As illustrated in FIG. 3, bond pads 21 of integrated circuit device 20 are formed along the top of the entire integrated circuit device so that the bond pads now reside directly over the active circuitry region of integrated circuit device 20. By forming bond pads in both the center and periphery of integrated circuit device 20, more bond pads can be placed across the surface of the device than can be placed only within the peripheral region. In addition, active circuitry which underlies bond pads 21 of integrated circuit device can be directly coupled to its nearest bond pad using relatively short interconnect lines. This minimizes the resistive, capacitive, and inductive effects associated with routing interconnect lines over long distances, improving speed performance.

FIG. 4 is an illustration of a cross-section of integrated circuit device 20 after mounting to a package substrate 22. In order to mount integrated circuit device 20 to package substrate 22, solder balls 24 are placed on each of bond pads 21 to electrically couple each bond pad 21 to its corresponding pad on package substrate 22. Each corresponding pad on package substrate 22 is, in turn, coupled to an external pin 23. Integrated circuit device 20 is mounted to package substrate 22 with its top-side facing towards the package substrate. In other words, in comparison to the method used to mount integrated circuit device 11 to its package substrate in FIG. 2, integrated circuit device 20 is "flipped." For this reason, the design of integrated circuit device 20 illustrated in FIG. 3 and its subsequent packaging method illustrated in FIG. 4 is referred to as flip-chip technology. The technology is also known as Controlled Collapsable Chip Connection (C4), named after the package mounting technique of using solder to replace bond wires.

Integrated circuit device 11 (as shown in FIG. 1) or integrated circuit device 20 (as shown in FIG. 3) illustrate bond pads 13 and 21, respectively, available for electrical coupling to a corresponding pad on package substrate, 15 and 22, respectively. In general, after the device is made, bond pads 13 and 21, respectively, lie beneath dielectric layers and must be exposed for bonding to package 15 and 22, respectively. In the typical process, bond pads 13 and 21, respectively, are covered by a hard passivation layer of, for example, silicon nitride ($Si_3N_4$). This hard passivation layer is covered by a soft passivation layer of, for example, a photodefinable polyimide. The hard and soft passivation layers protect the device from the ambient, for example, scratches, moisture, and impurities.

FIGS. 5–8 illustrate the prior art process for exposing bond pads 13 or 21, respectively. FIG. 5 shows an integrated circuit structure 50 with bond pad 55 overlying structure 50. Examples of conventional bond pads include aluminum (Al), aluminum-copper (Al—Cu) alloy, aluminum-copper-silicon (Al—Cu—Si) alloy metal bond pads. Overlying bond pad 55 is hard passivation layer 60, such as for example, $Si_3N_4$. Above $Si_3N_4$ layer 60 is a soft passivation layer 65, such as for example, a photodefinable polyimide passivation layer. FIG. 5 illustrates the first processing step of exposing bond pad 55 to a light source. In this step, a portion 70 of photodefinable polyimide layer 65 is protected from light exposure. The remaining photodefinable polyimide layer 65 is exposed to ultraviolet light and developed. During development, the unexposed region of photodefinable polyimide layer 65 is dissolved, exposing $Si_3N_4$ hard passivation layer 60 in that area.

FIG. 6 shows the second step in the prior art process of exposing the integrated circuit bond pad. In FIG. 6, the exposed $Si_3N_4$ layer 65 is etched to remove $Si_3N_4$ from an area above bond pad 55. A suitable etchant is, for example, a $NF_3$/He and $SF_6$/He etch chemistries.

Once bond pad 55 is exposed, the wafer is cured through a pad cure step as shown in FIG. 7. The pad cure step cures the remaining photodefinable polyimide layer 65. The curing step also results in degassing/outgassing of particles from polyimide layer 65, in part, particles resulting from the prior $Si_3N_4$ etching step, to form on bond pad 55. Further, the curing step is a high temperature cure which oxidizes a portion of bond pad 55. Thus, for example, oxidized aluminum metal becomes alumina or sapphire which forms a hard coating on bond pad 55. FIG. 7 shows oxidized and particle residual layer 70 formed on bond pad 55. In order to bond a suitable package wire to bond pad 55 or to test the integrated circuit at bond pad 55, residual layer 70 must be diminished or removed. Thus, FIG. 8 shows a cleaning step of a sputter etch that is typically used to remove residual layer 70 to expose bond pad 55. Since the oxidized particle-deposited bond pad residual layer 70 is generally hard, the sputter etch must be significant to diminish residual layer 70.

To effectively bond a bond pad to a package, a portion of the bond pad surface must be free of residual particles and oxide formation. Therefore, great care must be practiced to expose a portion of the metal surface of the bond pad.

Wafer testing and sorting typically involves the use of probing technology wherein a probe card containing probe features engages the bond pads on a die so as to connect the pads to a circuit tester. FIG. 9 illustrates a typical testing apparatus including a tester 75, test head 76, and handler 77, that is used to test the performance of a die on a wafer. As illustrated, probe card 72 sits below and in contact with test head 76. During testing, the handler 77 supports the wafer on platform (chuck) 78 and positions the wafer so as to precisely align the bond pads of a die to be tested with the probe features on the probe card. Chuck 78 is connected to a staging device 79. Staging device 79 typically positions chuck 78 along an X-Y plane by moving along a stage floor 73 on a ball screw stage assembly. Staging device 79 may also position chuck 78 by floating above stage floor 73 on a magnetic air bearing. Chuck 78 typically includes a vacuum chuck wherein the wafer being tested is held in position by drawing a vacuum within a plurality of interconnecting channels that are formed within the surface of chuck 78. Once aligned, chuck 78 is raised such that the bond pads of the die are forced against the probe features on the probe card.

When testing a wafer, it is often hard to prevent the oxidation of the aluminum bond pad surface prior to testing. Therefore, most categories of probing or testing utilize some form of "scrub" at the touch-down phase of a probe feature to a bond pad. Scrub applies to the process where the probe features on a probe card pierce (scrub) the layer of oxide that grows quickly on an exposed aluminum bond pad, despite a previous exposure by, for example, a sputter etch. Generally, scrub applies to the destruction of any non-conductive layer that produces a barrier between the test probes of a probe card and the base metal of a bond pad. The purpose of the scrub is to break through the non-conductive layer on the bond pad in order to establish a good electrical contact between the probe features and the base metal of the bond pad. Scrub occurs when the components of the handler forces the wafer, and subsequently, the bond pads of a die, against the probe features on the probe card causing the probe features to deflect and the non-conductive layer to break. The scrub is generated by a small horizontal movement of each probe feature across the surface of each corresponding bond pad as the probe features deflect. As the probe features move across the bond pad, they break and penetrate the non-conductive oxide layer thereby establishing a good electrical contact between the probe features and the bond pads. This type of scrub is referred to as "passive" scrub. Typically, the amount of deflection of the probe features, and, hence, the amount of scrub achieved, is proportional to the force applied by the movement of the wafer against the probe card features. The additional movement of a wafer toward a probe card after initial contact with a probe feature is known as "overdrive."

Probe cards currently available are generally of the passive scrub type. The multilayer cantilever tungsten needle probe card 80, as illustrated in FIG. 10 via a cross-sectional view, is one example. As schematically shown in FIG. 10, probe card 80 possesses a printed circuit board 81 with tungsten needles 82 extending out from probe card 80. In general, a ceramic support ring 84 is inserted into a counterbore in printed circuit board 81 on which probe needles 82 are held in position by an epoxy ring 88. Each needle 82 contains a tip or probe feature 83 for making contact with the bond pads of a die. As previously discussed, the amount of scrub (or horizontal displacement) achieved on the surface of a bond pad is proportional to the vertical displacement applied by the movement of the wafer against the probe card features. Probe card 80 is referred to as a multilayer probe card, because probe card 80 has multiple layers of probe needles 82 extending from epoxy ring 88 to accommodate existing integrated circuit device densities, i.e., existing pad pitches.

FIG. 10 illustrates that in prior art configurations, epoxy ring 88 has a vertical sidewall from which probe needles 82 extend. FIG. 10 also illustrates that probe needles 82, including probe tips 83 have a common beam length ($L_B$) and extend from epoxy ring 88 at a common beam angle.

A tungsten needle probe card, as illustrated in FIG. 10, typically requires overdrive levels of 0.002 to 0.004 inches to achieve good electrical contact at the bond pads. Thus, tungsten needle 82 must be of sufficient dimensions, e.g., diameter, beam length, etch length (which determines the tapered geometry), and extrinsic durability to break through an oxide layer present on a bond pad.

FIG. 11 shows an expanded view of a portion of the multilayer probe card of FIG. 10 with three needles 82 extending out from epoxy ring 88, each needle or beam 82 containing a tip or probe feature 83 for making contact with the bond pads of a die. FIG. 11 also shows epoxy ring 88 having a vertical sidewall from which beams 82 extend. In order to accommodate existing pad pitches under 100 microns, beams 82 are generally stacked or layered in epoxy ring 88. FIG. 11 shows a probe assembly having three layers of probe needles or probe beams. The stacking or layering of beams 82 allows adjacent pads of reduced dimensions to be tested while maintaining the mechanical integrity of beams 82 in epoxy ring 88. Prior art probe cards, as illustrated in FIG. 11, use beams 82 of precisely the same length ($L_B$) and extending away from epoxy ring 88 at precisely the same beam angle $\theta_B$, such as for example 7°. Prior art probe cards also use probe tips 83 of different vertical length ($L_T$), such as for example in FIG. 11, tips 83 of 8 mils, 18 mils, and 25 mils. Variable tip length yields inconsistent scrub lengths.

There are number of problems associated with the passive scrub cantilever needle probe card and the scrubbing process. First, the high overdrive levels required to achieve good electrical contact between the probe features and bond pads cause the probe features to bend, break, and wear more quickly, resulting in increased replacement and repair costs. Another problem is that it sometimes requires two or more touch-downs per die test to break through the pad oxidation layer. This prolongs the amount of time to perform a die test and it diminishes the effective life of a probe card. Yet another problem with passive scrub needle cards is that stray particle and oxide buildup often occur at the tip of the probe features. Stray particle and oxide buildup contributes to high contact resistance between the probe feature and bond pad and electrical shorts between the probe needles. High contact resistance causes inaccurate voltage levels during device testing due to the voltage produced across the probe tip. This may cause a device to incorrectly fail a test resulting in lower test yields and, for example, bin switching, i.e., the recharacterization of device performance based upon testing results. Thus, the oxidation of the bond pads and the methods for scrubbing the pads to effectively test the device present many problems that hamper consistent testing or probing of wafers.

As noted above, as device densities increase on a die, the number of bond pads also increases. The common way this is accomplished is by placing the bond pads closer together, thus decreasing the pad pitch, i.e., the distance between the center of adjacent pads. Current technologies have a typical pad pitch above 80 microns. With pad pitches of 100 microns or more, conventional probe card designs have been able, with varying consistency, to scrub and make contact to the bond pad surface. This is so because the probe feature is of sufficient dimension, e.g., diameter and durable enough to break through the oxide layer and scrub the bond pad. As the pad pitch continues to decrease, sufficiently durable probe features may not be able to accommodate the smaller feature size, i.e., the probe features may not be able to get in the vicinity of the bond pad to scrub the bond pad surface. Accordingly, the probe feature must itself get smaller dimensioned and less durable to accommodate a reduced pad pitch. A less durable probe feature, however, will have difficulty breaking through an oxide layer and scrubbing the bond pad surface.

SUMMARY OF THE INVENTION

A method of exposing a bond pad of an integrated circuit is disclosed. The method includes providing an integrated circuit having a bond pad, a first passivation layer overlying a top surface of the bond pad, and a second passivation layer overlying the first passivation layer, removing a portion of the second passivation layer to expose an area of the first passivation layer above the area portion of the bond pad, curing the second passivation layer, and etching a portion of the exposed area of the first passivation layer to expose the top surface of the bond pad. A method of coupling an integrated circuit chip to a chip package is also disclosed as is a method of probing the bond pads of an integrated circuit.

A probe card is further disclosed. In one embodiment, the probe card includes a probe assembly coupled to a printed circuit board, the probe assembly having a sloped sidewall portion with a plurality of probing beams extending from the sidewall portion.

Additional features and benefits of the invention will become apparent from the detailed description, figures, and claims set forth below.

DETAILED DESCRIPTION OF THE INVENTION

A method of exposing a bond pad of an integrated circuit to improve the electrical connection between bond wires of an integrated circuit package or the test probes of a probe card and the bond pads of an integrated circuit is described. Also described is a probe card with features that improve contact force and uniform mechanical contact pressure between the probe feature and an engaged bond pad. Together the improved method and the improved probe card allow wafer testing of high pin count integrated circuits with peripheral pad pitches including in the sub-80 micron regime. Further, the improved method and the improved probe card consistently meet a less than one ohm pad to probe contact resistance standard required for effective and accurate testing of high speed microprocessors and minimizing yield loss due, for example, to the bin switching effect on multiple probing.

In the following description, numerous specific details are set forth such as material types, dimensions, processing steps, etc., in order to provide a thorough understanding of the invention. One skilled in the art will understand these specific details need not be employed to practice the invention. In other instances, well known elements and processing techniques have not been shown in particular detail in order to avoid unnecessarily obscuring the invention.

Figure 1:
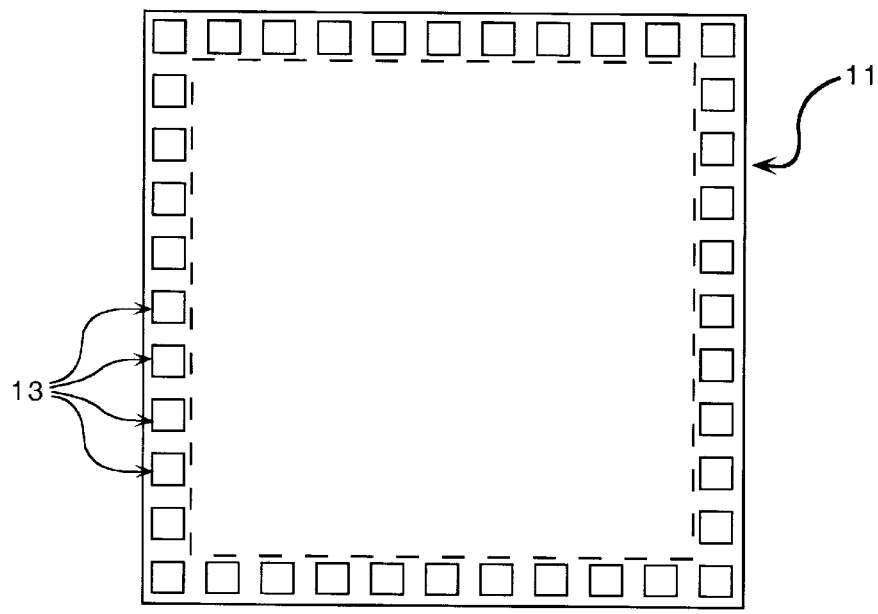
FIG. 1 is a schematic illustration of an integrated circuit device intended for wire bond packaging.
Figure 2:
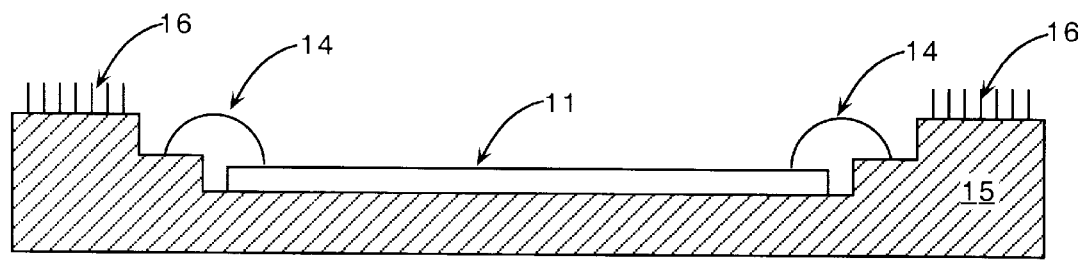
FIG. 2 is a schematic illustration of a cross-sectional view of the integrated circuit device of FIG. 1 after the device has been packaged.
Figure 3:
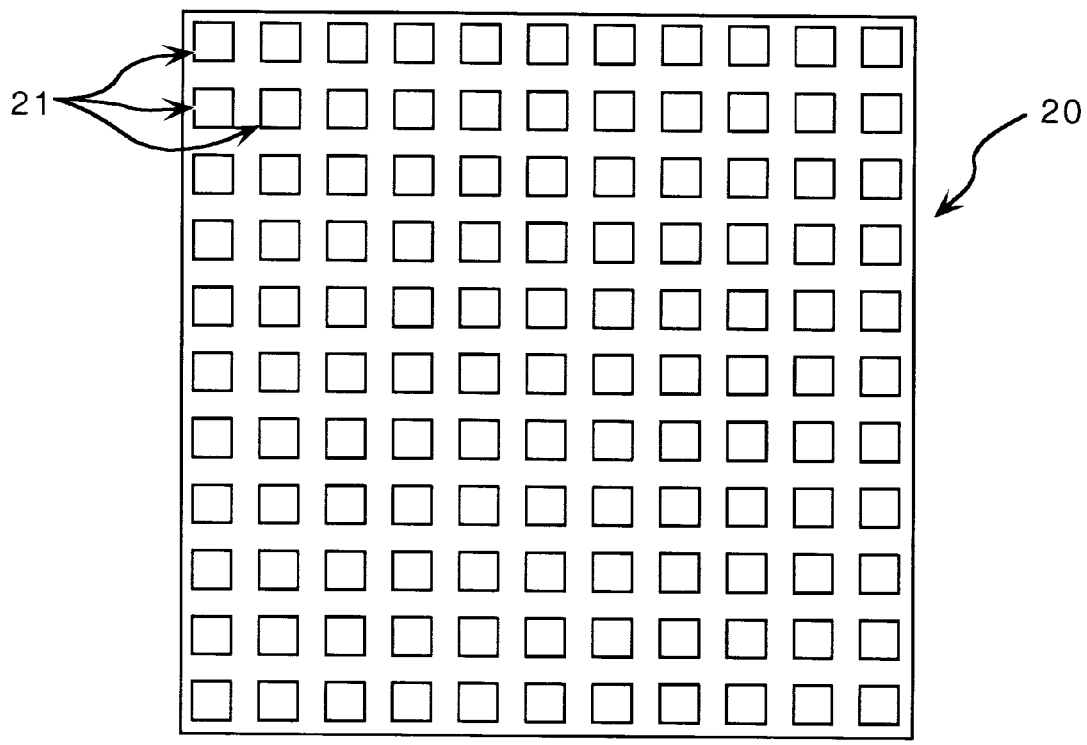
FIG. 3 is a schematic illustration of an integrated circuit device intended for C4 packaging.
Figure 4:
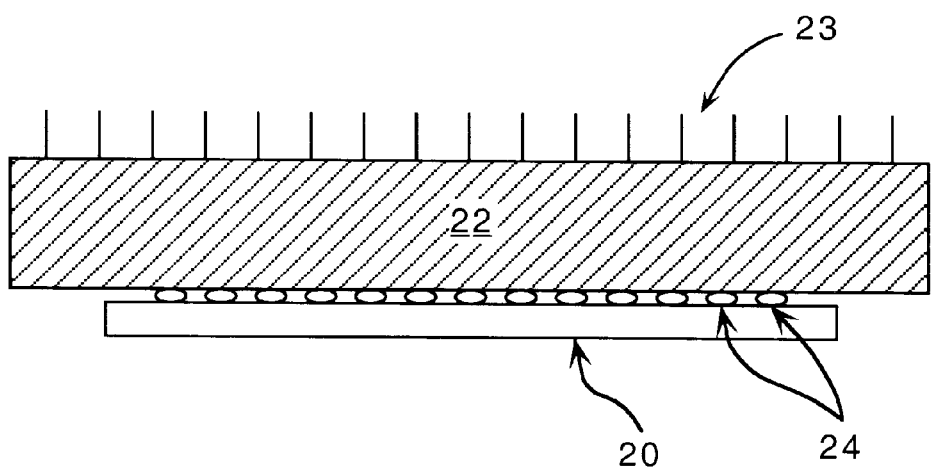
FIG. 4 is a schematic illustration of a cross-sectional view of the integrated circuit device of FIG. 3 after the device has been packaged.
Figure 5:
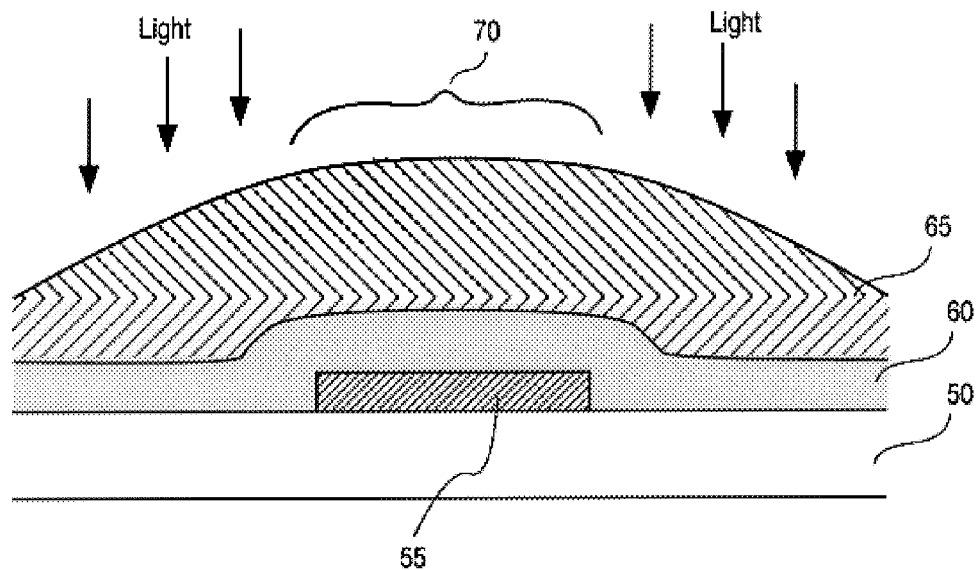
FIG. 5 is a schematic illustration of a cross-sectional side view of an integrated circuit structure having a bond pad encompassed in hard and soft passivation layers wherein a portion of the soft passivation layer is exposed to ultraviolet light.
Figure 6:
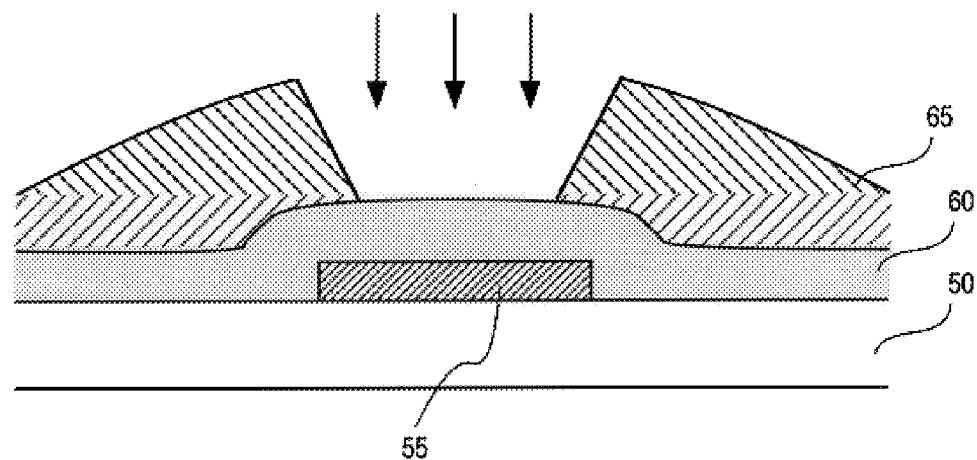
FIG. 6 is a schematic illustration of the portion of the integrated circuit structure shown in FIG. 5 wherein an etch is used to remove the hard passivation layer from portion of the bond pad.
Figure 7:
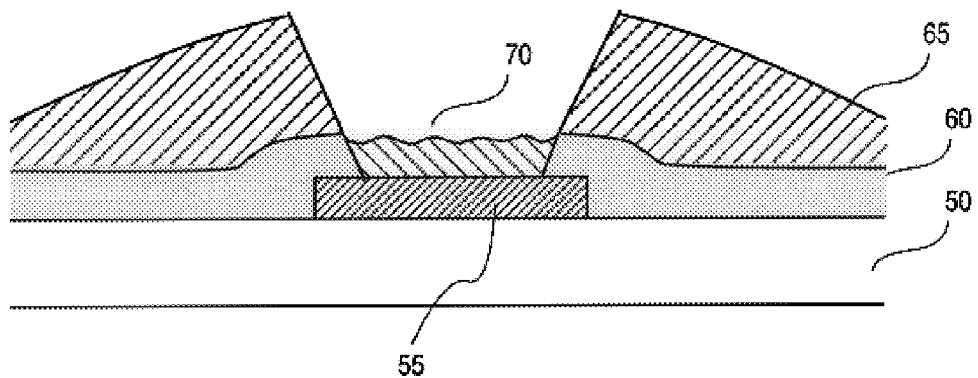
FIG. 7 is a schematic illustration of a portion of the integrated circuit structure of FIG. 6 showing the hard passivation layer removed from a top surface portion of the bond pad and a residual layer formed on the bond pad surface during a curing step.
Figure 8:
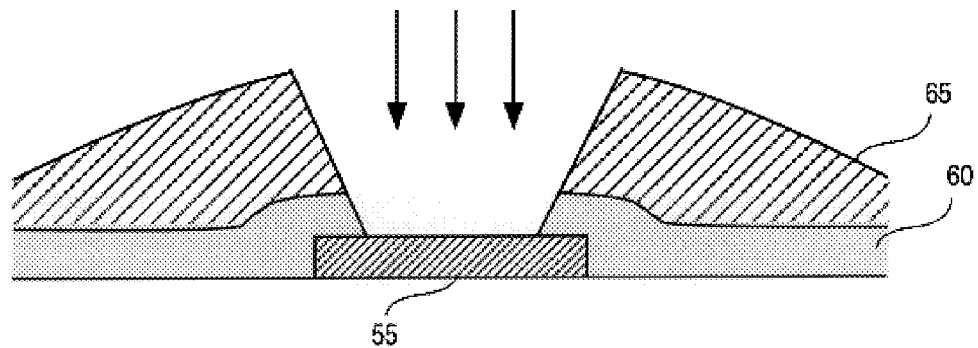
FIG. 8 is a schematic illustration of the integrated circuit structure shown in FIG. 7 wherein the residual layer has been removed to expose the bond pad.
Figure 9:
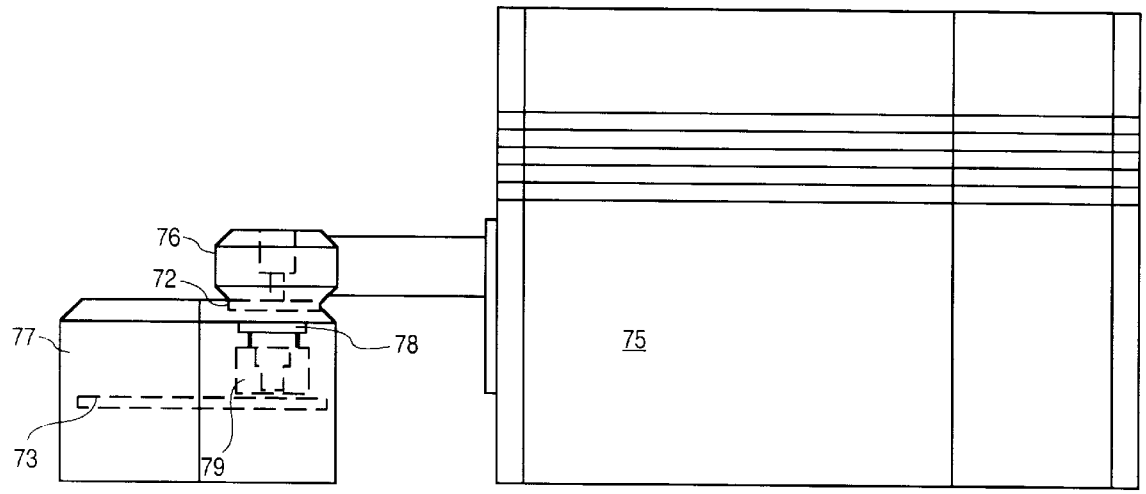
FIG. 9 is a schematic illustration of a tester, test head, and handler.
Figure 10:
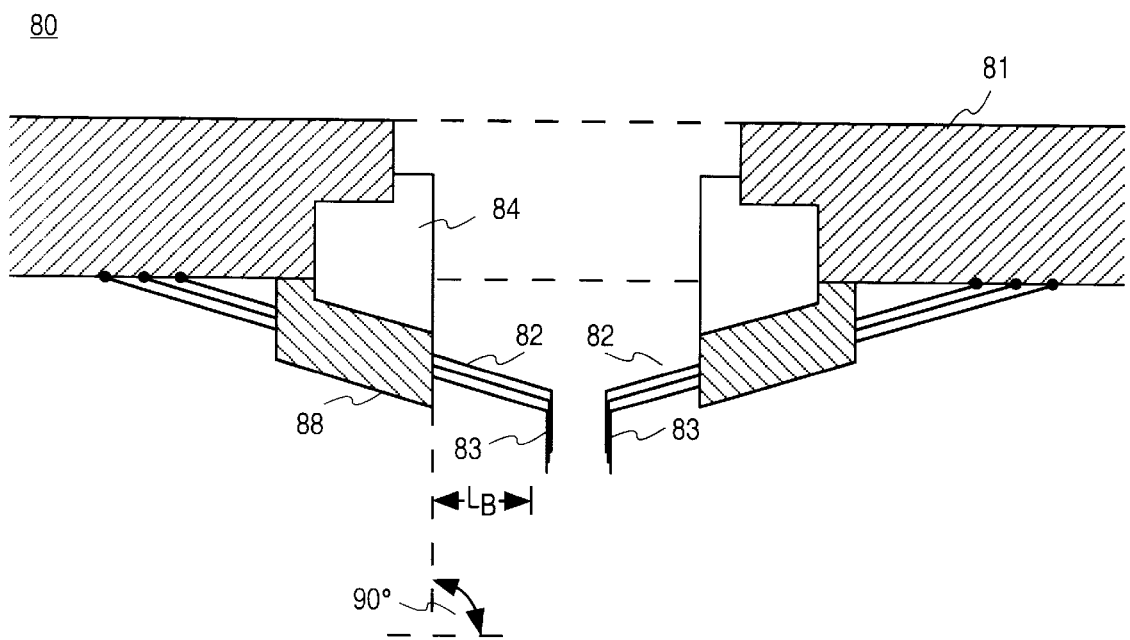
FIG. 10 is a schematic illustration of a side view of a multi-layer cantilever needle probe card.
Figure 11:
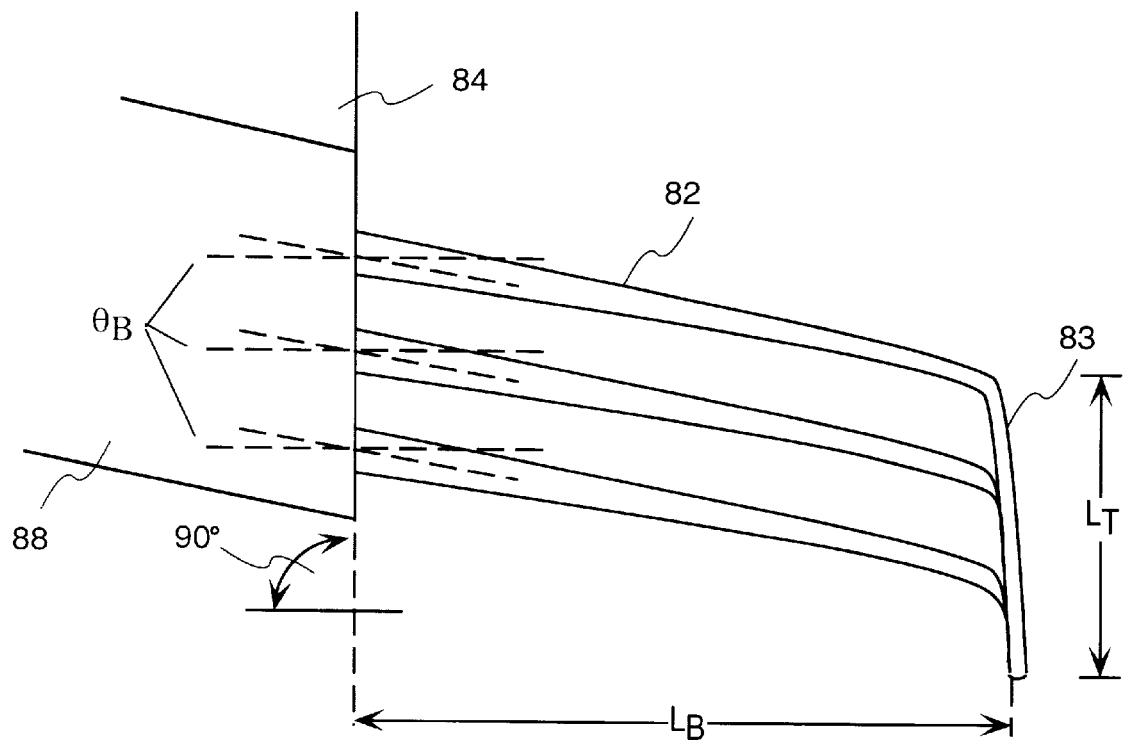
FIG. 11 is a schematic illustration of an expanded view of a portion of the multi-layer probe card of FIG. 10.
Figure 12:
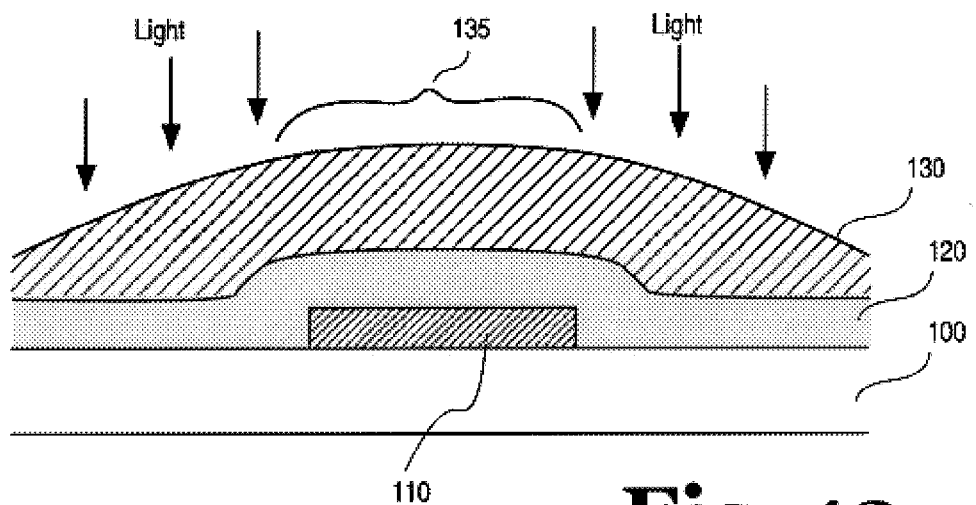
FIG. 12 is a schematic illustration of a portion of an integrated circuit structure showing hard and soft passivation layers overlying a bond pad and exposure of a portion of the bond pad to ultraviolet light in accordance with the invention.

FIGS. 12–15 schematically illustrate cross-sectional views of a portion of an integrated circuit having a bond pad and an embodiment of the improved method of exposing a bond pad. FIG. 12 shows a conventional integrated circuit structure 100 that can be, for example, either a conventional layout for top side bonding to an integrated circuit package (as shown in FIGS. 1 and 2) or a C4 integrated circuit (as shown in FIGS. 3 and 4). It is to be appreciated that the invention need not be limited to use with these layouts and that other integrated circuit layouts are contemplated for use in the process of the invention, such as for example, Tape Automated Bonding (TAB) assemblies. In FIG. 12, an aluminum bond pad 110 overlies integrated circuit 100. Overlying bond pad 110 is a hard passivation layer 120 of, for example, $Si_3N_4$ or other dielectric (e.g., $SiO_2$, $SiO_xN_y$, etc.). Over hard passivation layer 120 is a photodefinable second passivation layer 130, that is, for example, a photodefinable polyimide. The first step, as shown in FIG. 12, is to expose photodefinable polyimide layer 130 to ultraviolet light while masking an area 135 directly above bond pad 110 and develop the polyimide. In this manner, polyimide layer 130 remains in all exposed areas but not the unexposed area denoted by area 135. It is to be appreciated that the soft passivation layer is not limited to a photodefineable polyimide. Other soft passivation layer materials, such as for example, other polyimides or other organic materials, may be used and conventional techniques such as photolithography using a resist, can be used to expose hard passivation layer 120.

Figure 13:
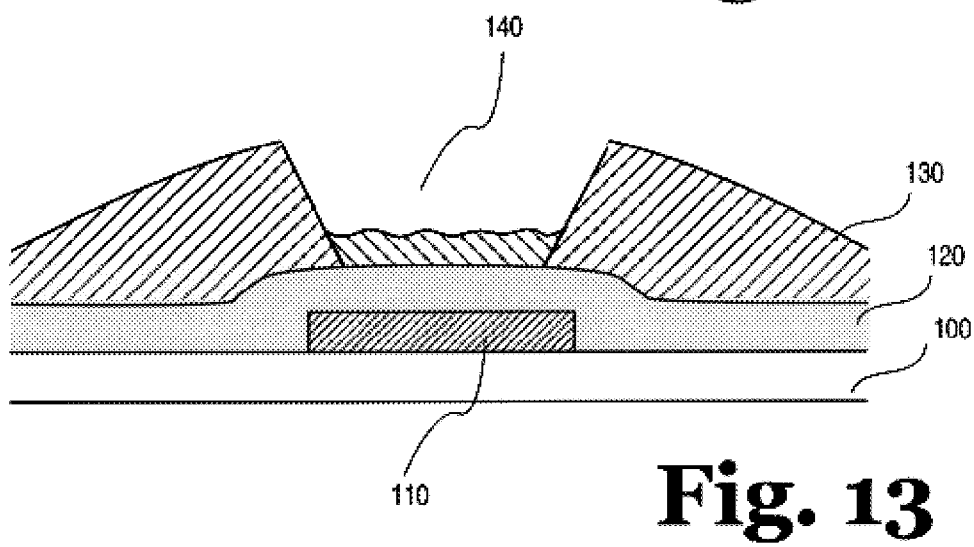
FIG. 13 is a schematic illustration of the portion of the integrated circuit device shown in FIG. 12 wherein the structure is exposed to a curing step in accordance with the invention.

Next, as shown in FIG. 13, polyimide layer 130 is cured, such as for example, by exposing the wafer to a temperature of about 400° C. During cure, polymer chains cross-link and imidize and solvent is driven away. This process makes polyimide layer 130 harder. This process also tightens the distribution of some electrical parameters of the transistors.

The curing process results in some outgassing and formation of deposits/contaminates, illustrated as residual layer 140, above the exposed hard passivation (e.g., $Si_3N_4$) layer 120. Unlike the prior art process, the presence of $Si_3N_4$ layer 120 protects bond pad 110 from contamination by deposition and oxidation during the curing step.

Figure 14:
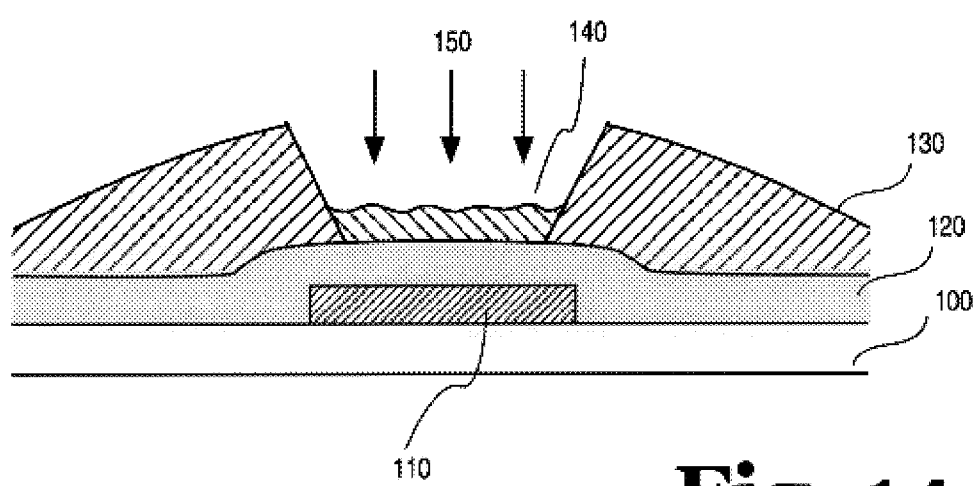
FIG. 14 is a schematic illustration of the portion of the integrated circuit device of FIG. 13 wherein a portion of the structure is exposed to an etch in accordance with the invention.

Once polyimide layer 130 is cured, the exposed $Si_3N_4$ layer 120 is etched by a plasma etcher. The plasma etcher uses a conventional etchant, such as for example, a $NF_3$/He and $SF_6$/He etch chemistry. The etch removes residual layer 140 and a portion of exposed $Si_3N_4$ layer 120 that is directly over bond pad 110 thus exposing a clean metal, such as for example, aluminum bond pad 110. FIG. 14 illustrates this etching step.

Figure 15:
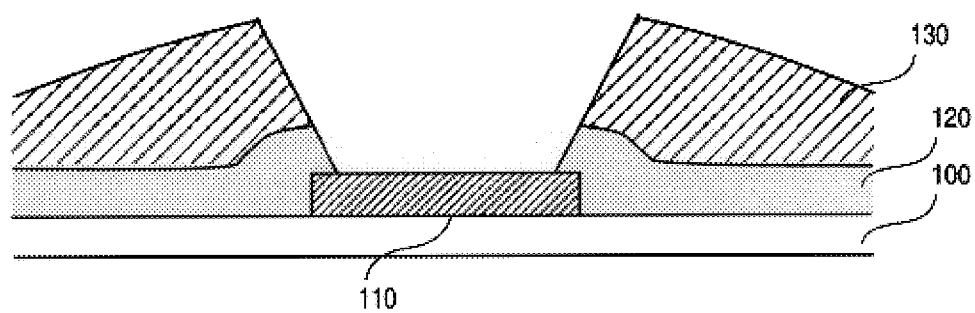
FIG. 15 is a schematic illustration of the integrated circuit device of FIG. 14 wherein a residual free surface of a bond pad is exposed in accordance with the invention.

In the embodiment described, the $Si_3N_4$ etch chemistry contained fluorine. In the process of this etch, it is possible that some fluorine containing residues were left on the surface of bond pad 110 or on polyimide layer 130. To the extent that residual fluorine remains on the surface of bond pad 110, the fluorine atoms might inhibit the bonding between the package and the bond pad. To remove such fluorine ions, an optional, very short duration, sputter etch (a safety etch) may be used to remove residual fluorine ions. FIG. 15 illustrates the exposed bond pad after the hard passivation etch step and the optional sputter etch.

Figure 16:
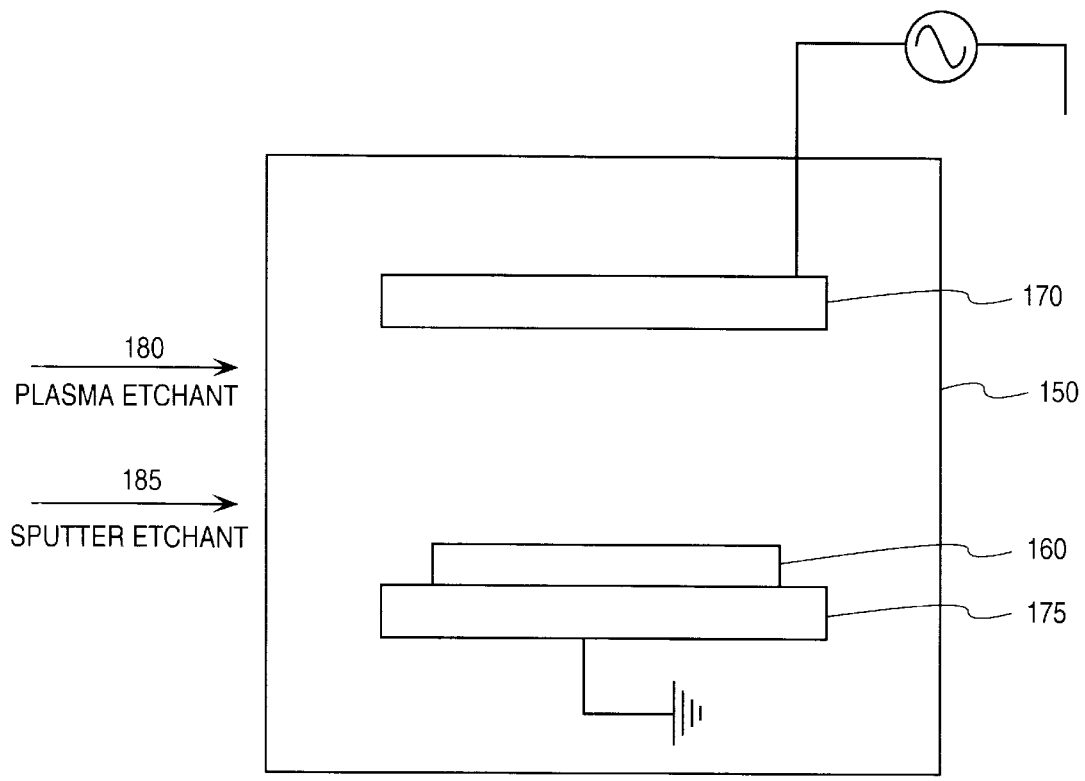
FIG. 16 is a schematic illustration of an etching system in accordance with the invention.

As noted above, the optional sputter etch directly follows the hard passivation layer 130 etch. Thus, the invention promotes economy of equipment in that the sputter etch can be incorporated into the pad etch (e.g., $Si_3N_4$ etch) equipment as opposed to separating the pad etch equipment and sputter etch equipment. FIG. 16 shows a schematic of such a system utilizing a parallel electrode reactor. In FIG. 16, wafer 160 is placed in a chamber between a pair of electrodes 170 and 175 of approximately the same size. Electrode 170 is connected to an rf power supply and electrode 175 to ground. Wafer 160 is placed on grounded electrode 175. Wafer 160 is then exposed to a plasma etch 180 that utilizes, for example, an $NF_3$/He and $SF_6$/He etch chemistry to etch a dielectric such as $Si_3N_4$. Typical energies of the bombarding ions arc 1–100 eV and the etch is carried out typically at pressures greater than 100 mtorr. Plasma etch 180 is then followed by a conventional Argon (Ar) or Ar/H sputter etch 185 in the same or different chamber of the same etch system 150. Typical sputter etch conditions include 1000 W power, 200 V bias, and 1 mtorr background pressure. The etch system of the invention can be a batch system or a single wafer system.

The process described above changes the sequence of processing steps. The changed sequence eliminates the possibility of contaminants from degassing/outgassing of other sources by curing the photodefinable second passivation layer 130 prior to etching the hard passivation layer to expose bond pad 110. The process does not need a significant sputter etch to clean the pad. The sputter etch described with respect to the process embodiment of the invention is a short duration sputter etch needed only to remove residual ions left behind from the pad etch. The prior art required a substantial duration sputter etch to clean the bond pad surface of deposits/contaminants and oxide. Thus, the invention contemplates fewer processing steps which translates into faster manufacturing and testing of integrated circuit devices. Further, because the short duration sputter etch follows the pad etch, the sputter etch equipment may be incorporated in the pad etch equipment which means the total equipment used is less and can be cheaper.

Figure 17:
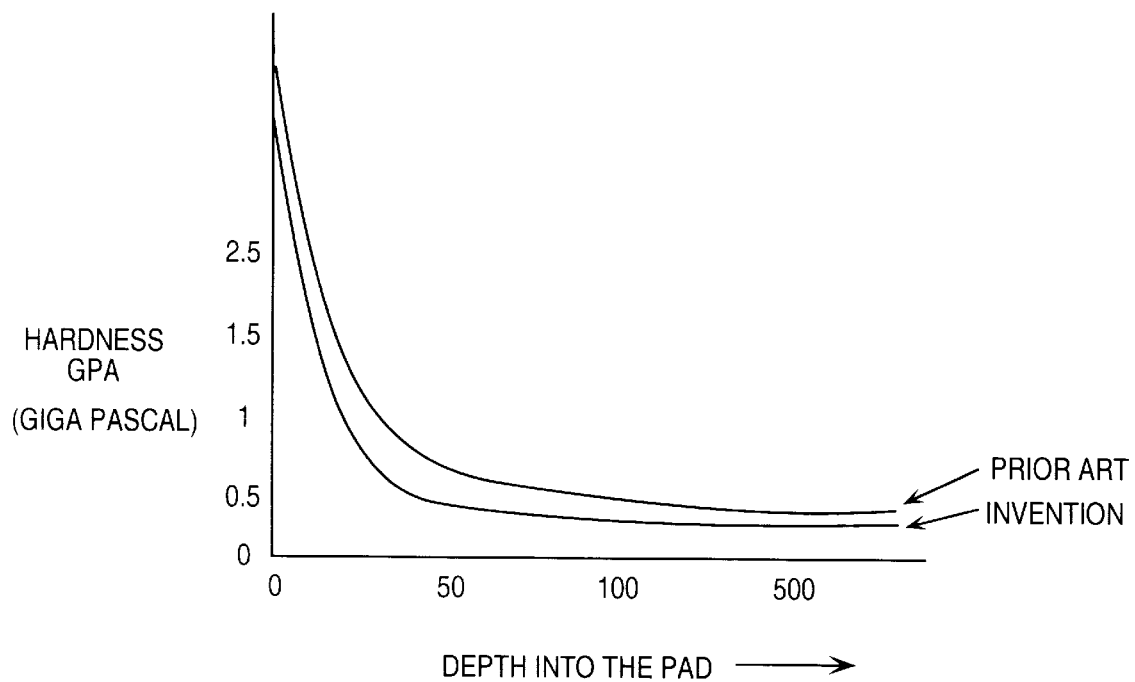
FIG. 17 is a graphical representation of hardness of the surface of a bond pad surface exposed by a prior art process and a bond pad surface exposed by an embodiment of the invention.

The above process creates a measurably superior pad surface for temporary electrical contact during probing/testing and permanent wire-bond assembly operations. The process provides mechanically softer aluminum surface as measured through nano-indentation as compared with the prior art. FIG. 17 illustrates the different properties of an aluminum bond pad surface exposed in the prior art and as exposed as in the process of the invention through depth penetration by a diamond probe into the surface of the bond pad. FIG. 17 shows that the aluminum bond pad surface exposed by the process of the invention is mechanically softer than the bond pad exposed by a prior art process, indicated by a lower pad penetration resistance of the diamond probe into a bond pad exposed by the process of the invention than into a bond pad exposed by a prior art process.

The process of the invention also reduces the aluminum oxide thickness. It has been determined experimentally that the oxide thickness of the process of the invention can be obtained in the range of 10–30 Å. This compares to an oxide thickness of prior art processes of 60–80 Å. It is clear that the measured oxide thickness is significantly reduced by the process of the invention, thus minimizing the mechanical means necessary to scrub the bond pad surface. This translates into smaller diameter, less durable probing features, which translates into smaller bond pad pitch.

By removing the deposits/contaminants brought about by degassing and outgassing during the curing step of the photodefinable passivation layer, the invention provides an improvement in the electrical thin film contact condition to reduce surface residues on the bond pad surface. This result follows because the virgin aluminum surface exposed by the invention is amenable to better contact with the probe needle.

Figure 18:
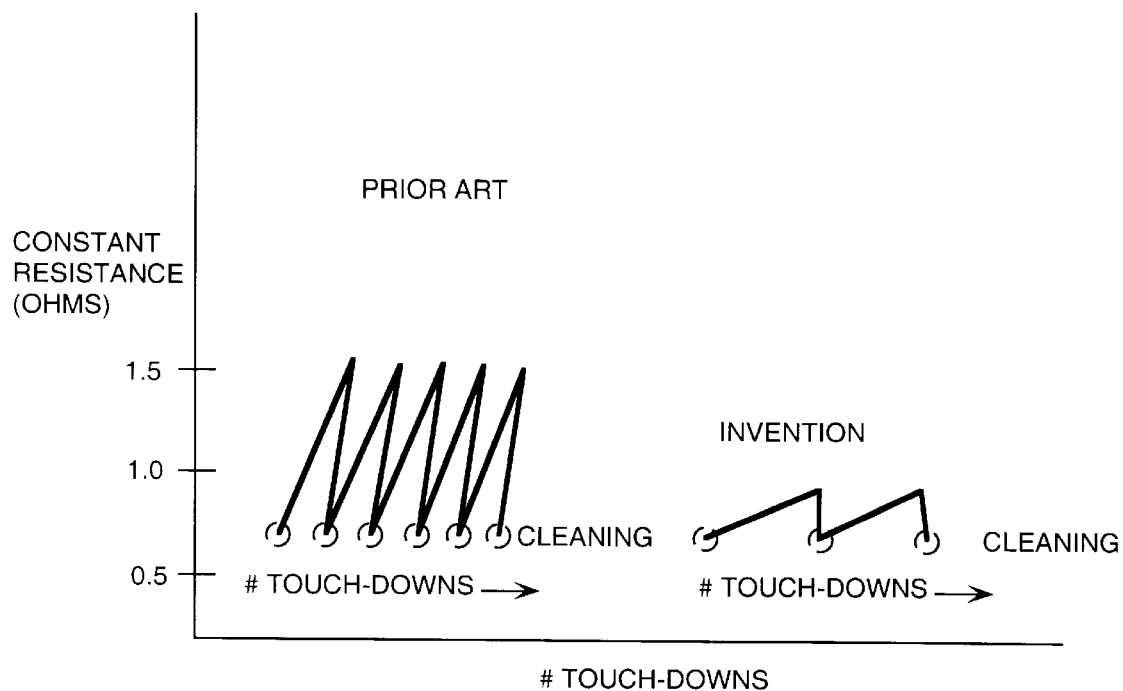
FIG. 18 is a graphical representation of the nominal contact resistance between a probe feature and a bond pad as a function of time for touch-downs on bond pads exposed by a prior art process of the invention.

The bond pad probing process described above offers the highest degree of probe card life extension through minimized mechanical/abrasive cleaning while maintaining low, nominal and maximum probe to bond contact resistance. FIG. 18 shows a graph of the nominal contact resistance between a probe feature and a bond pad over time for touch-downs on bond pads exposed by a prior art process and by the process of the invention. FIG. 18 shows that the resistance measured on the bond pads exposed by the process of the invention is very consistent, maintained in the less than one ohm region over a series of touch-downs by probe features, which shows that the bond pad surface is very clean and the probe features do not get significantly soiled which would otherwise cause the resistance to increase. Such consistency is not evident with bond pads exposed by a prior art process. The probe features soil and show contact resistances greater than one ohm with prior art-exposed bond pads. The jagged nature of the graphical representation shows the contact resistance increasing as the probe tips get soiled, followed by a probe cleaning, continued touch-downs, and continued soiling (increasing resistance), cleaning, etc. FIG. 18 also shows that the probe features used to probe the bond pads exposed by the process of the invention do not need to be cleaned as often as the probe features used to probe bond pads exposed by a prior art process. This is represented by the example shown in FIG. 18 by fewer cleaning steps (2) for the process of the invention as compared to a prior art process (6). For example, in a prior art process the probe features were cleaned after every 10 touch-downs compared to the process of the invention that, it has been experimentally demonstrated, allows the probe features to be cleaned after 200 or more touch-downs while maintaining the less then one ohm resistance standard.

FIG. 18 demonstrates that the process of the invention yields a higher degree of re-sort repeatability using gross die bin results over the prior art process and reduced bin-switching. The process of the invention eliminates measurable process over-travel variations during mechanical and thermal settling.

The prior art process limited the achievable pad pitch of the integrated circuit structure. This was so, because ultimately the connection between the pad and a bond wire or probe tip is determined in part by the ability to break through the oxide layer formed on the pad by mechanical means, such as for example, the force of a probe tip. Thus, the probe tip had to be of sufficient diameter and of sufficient durability to break through an oxide layer formed on the aluminum surface. In the embodiment described in the invention, the pad pitch is not limited to the mechanical means available to break through an oxide layer formed on the bond pad. Instead, the bond pad is cleaned by an etch step (the pad etch), so the pad pitch is limited only by lithography techniques or the etching equipment. Thus, the embodiment described will allow pad pitches in the sub-80 micron ($\mu$m) regime, since a clean (i.e., not significantly oxidized) bond pad will result from the process described above in accordance with the invention. Further, the exposure of bond pads by the process of the invention improves the contact resistance between bond wire or solder bump and the bond pad. This allows for improved connections in bond wire processes and in solder and gold bump processes such as C4 and TAB.

The invention also relates to a multilayer probe card. The multilayer probe card provides more uniform contact force between the probe features and the bond pads as well as more uniform scrub between layers of probes than the prior art. The invention also allows for reduced mutual inductance in the probe assembly between power/signal probes and their complimenting ground probes. The multi-layer probe card is compatible with existing pad pitch regimes and may also be used for sub-80 $\mu$m pad pitch regimes.

Figure 19:
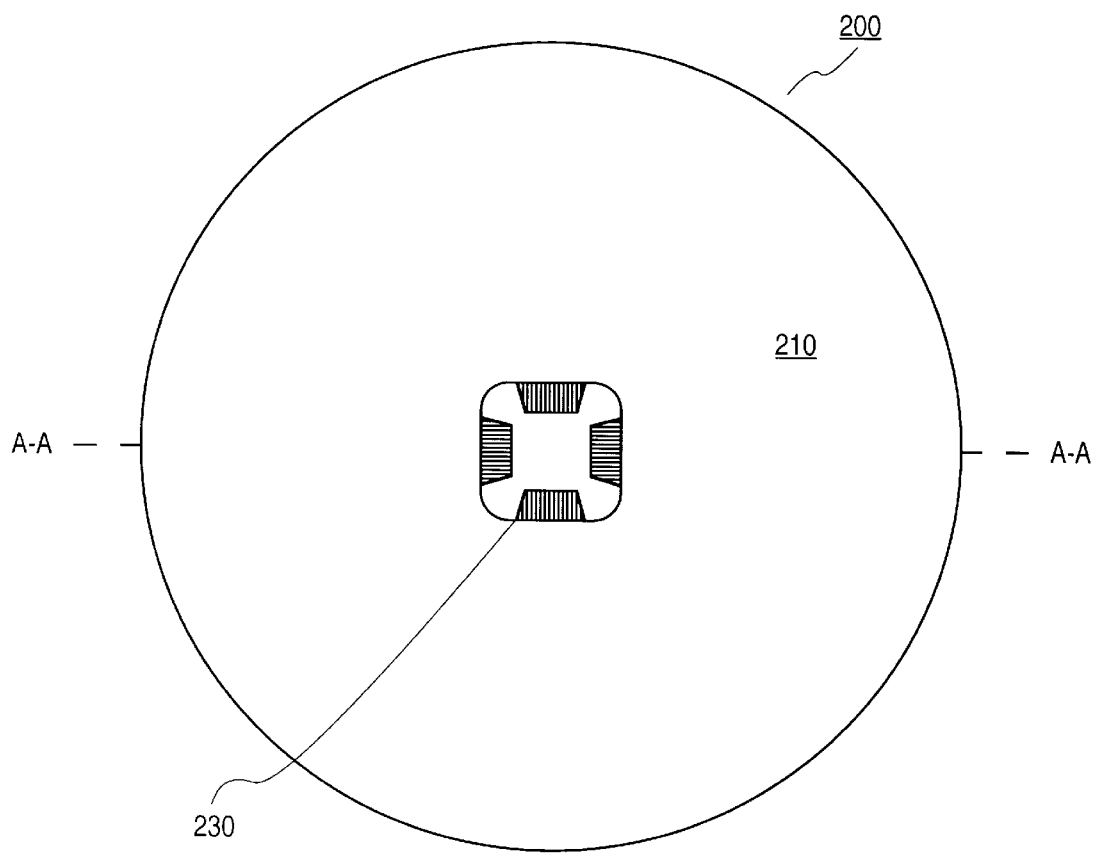
FIG. 19 is a schematic planar top view of a probe card assembly in accordance with the invention.
Figure 20:
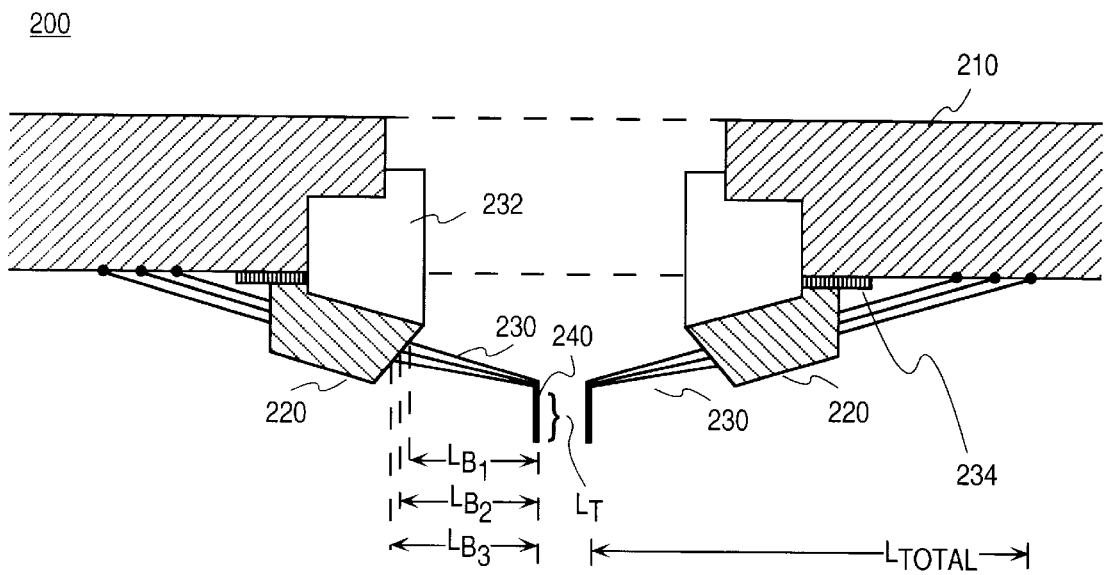
FIG. 20 is a schematic planar cross-sectional view taken through line A—A of FIG. 19 of a probe card in accordance with an embodiment of the invention.

FIG. 19 shows a top view of an embodiment that is an epoxy/needle multilayer probe card assembly 200 extending conductivity from a planar printed circuit board 210 to a plurality of multilayer probes 230 in a centrally disposed opening. FIG. 20 shows a cross-sectional view of probe card assembly 200 through line A—A of FIG. 19. In one embodiment, probe card 200 possesses a printed circuit board 210 with tungsten or similar conductive material probing beams 230 extending out from probe card 200. In general, a ceramic support ring 232 is inserted into a counterbore in printed circuit board 210 on which probe needles 230 are held in position by a probe assembly 220, such as for example an epoxy ring. Probe card 200 may further have a ground plane 234 formed on a lower surface thereof. Support ring 232 may also be of conductive material, e.g., aluminum, or have a conductive portion ground strip abutting ground plane 234. In this manner, probes 230 are positioned and maintained at a predetermined distance from ground strip 232, forming a wire-over-ground transmission line that provides a controlled impedance and minimizes the effects of high frequency operation, such as uncontrolled impedance paths and significant parasitic inductance of the wire probes.

Each probing beam or needle 230 contains a tip (probe feature) 240 for making contact with the bond pads of the die. Probes 230 including probe tips 240 are assembled in layers, each layer having its own beam length ($L_B$). FIG. 20 shows different beam lengths $L_{B_1}$, $L_{B_2}$, and $L_{B_3}$ for the different layers. The different probe beam lengths are accomplished by trimming probe assembly 220 at an angle relative to the printed circuit board 210 aperture, rather than normal to the top surface of printed circuit board 210 as is done in the prior art. The ability to vary beam lengths incrementally by layer allows etch lengths to be selected that provide for consistently matched probe force (measured in grams per mil) for each layer.

Figure 21:
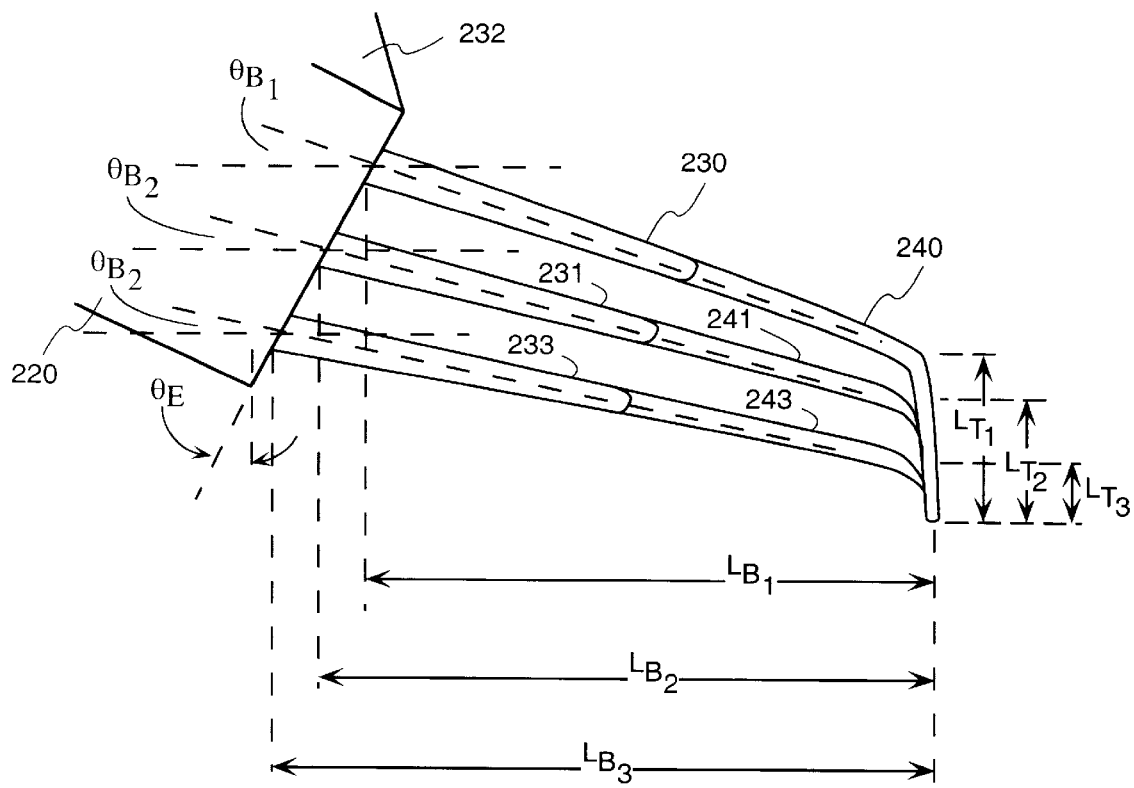
FIG. 21 is an expanded view of the probe card probe assembly of FIG. 20 illustrating a sidewall portion of the probe assembly having a sidewall portion with an angle relative to the top surface of the printed circuit board of the probe card of less than 90°.

FIG. 21 shows a magnified view of a multi-layer probe assembly 220, e.g., an epoxy ring, with probing beams or needles 230, 231, and 233 extending from probe assembly 220. In FIGS. 20–21, the probing beams are arranged in three layers at a nominal pad/probe pitch of less than 80 microns. The utilization of layers to mount adjacent beams provides the necessary mechanical stability to maintain the probing beams 230 at the desired probe/pad pitch. It is to be appreciated that the number of layers may vary depending on variables such as pad pitch, mechanical stability of the probe assembly, etc.

FIG. 21 shows one embodiment of a design of probe assembly 220. In one embodiment, probe assembly 220 is, for example, an epoxy ring having a (relative to the top surface of printed circuit board 210) sloped sidewall portion from which probe beams 230, 231, and 233 extend. In FIG. 21, the degree of slope of the sidewall portion is measured by $\theta_E$ and is less than 90° relative to the top substantially planar surface of printed circuit board 210. FIG. 21 also shows three probing beams 230, 231, and 233, respectively, in separate layers of epoxy ring 220. Each probing beam includes a probing feature 240, 241, and 243, respectively, extending from the end of the probing beam to make contact with an integrated circuit bond pad. As shown in FIG. 21, probing beams 230, 231, and 233, respectively, are individually configured (e.g., beam length, beam angle, tip length) to maximize the contact force and obtain more uniform contact force and better matching between layers of probe tips and bond pads. To accomplish this, the length of probing beam 230 (represented schematically as $L_{B_1}$), the length of probing beam 231 (represented schematically as $L_{B_2}$), and the length of probing beam 233 (represented schematically as $L_{B_3}$) are not necessarily identical. Further, the beam angle of probing beam 230 (represented as $\theta_{B_1}$), the beam angle of probing beam 231 (represented schematically as $\theta_{B_2}$), and the beam angle of probing beam 233 (represented schematically as $\theta_{B_3}$) are also not necessarily identical. Instead, the beam length $L_{B_1}$, $L_{B_2}$, and $L_{B_3}$, respectively, and beam angle $\theta_{B_1}$, $\theta_{B_2}$, and $\theta_{B_3}$, respectively, are separately and individually optimized based on the pad pitch. In one embodiment, beam angles $\theta_{B_1}$, $\theta_{B_2}$, and $\theta_{B_3}$, are 9°, 7°, and 5°, respectively, relative to the planar top surface of printed circuit board 210 for an epoxy ring having a sidewall angle $\theta_E$ of approximately 15°. For an epoxy ring having a sidewall angle $\theta_E$ of 5°–20°, and beam lengths $L_{B_1}$–$L_{B_3}$ ranging from 0.200 to 0.120 inches, beam angles $\theta_B$ can range from 5°–20° generally. In the embodiment described, the vertical lengths $L_{T_1}$, $L_{T_2}$, and $L_{T_3}$ of the probe tips 240, 241, and 243, respectively, are approximately 18, 13, and 8 mils. Thus, the distribution of tip lengths in the embodiment of the invention is much tighter than that of the prior art.

Figure 22:
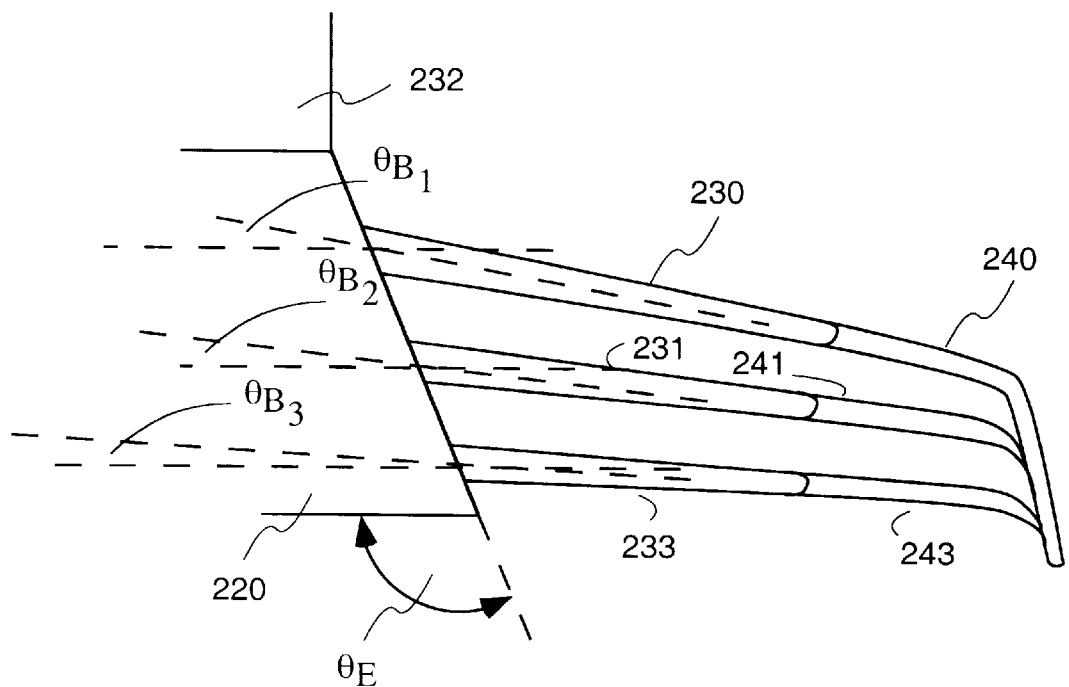
FIG. 22 is an expanded view of the probe card probe assembly of FIG. 20 illustrating a sidewall portion of the probe assembly having a sidewall portion with an angle relative to the top surface of the printed circuit board of the probe card of greater than 90°.

In the embodiment shown in FIG. 21, the sidewall portion of epoxy ring 220 has a slope (represented by $\theta_E$) that is less than 90° relative to the top surface of printed circuit board 210. The invention also contemplates that the slope of the sidewall portion of probe assembly 220 may be greater than 90° relative to the top surface of printed circuit board 210. Such an epoxy ring 220 is illustrated in FIG. 22, where probe assembly 220 has a sidewall portion that is sloped relative to the substantially horizontal top surface of printed circuit board 210 by an angle that is more than 90°, represented in FIG. 21 as $\theta_E$. Probe assembly 220 includes probing beams 230, 231, and 233 and probing features 240, 241 and 243, respectively.

Figure 23:
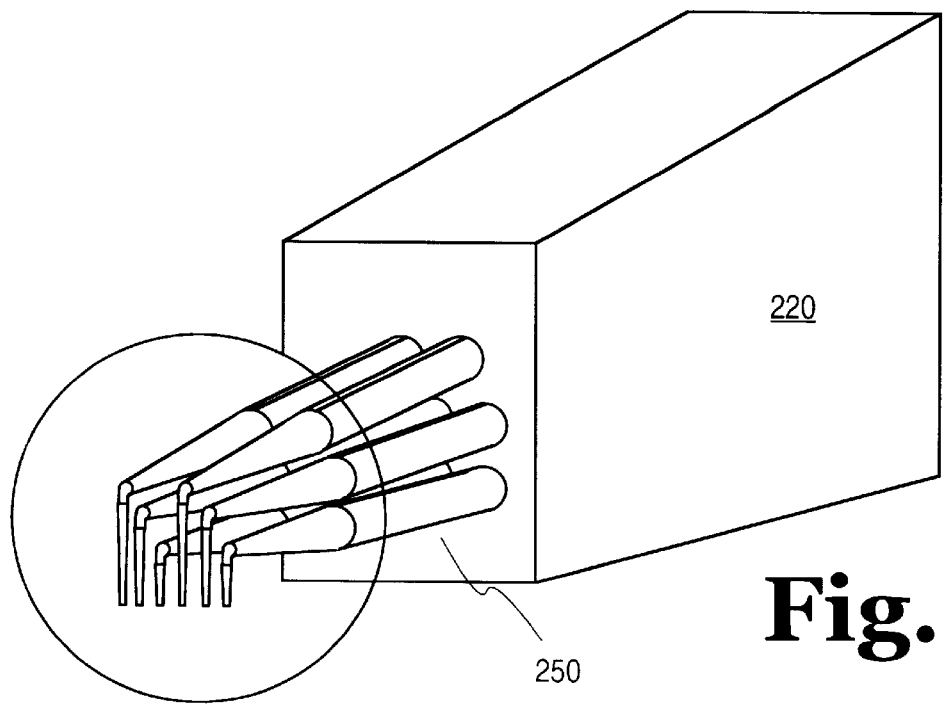
FIG. 23 is a schematic perspective view of the beam assembly of a multi-layer probe card in accordance with an embodiment of the invention.
Figure 24:
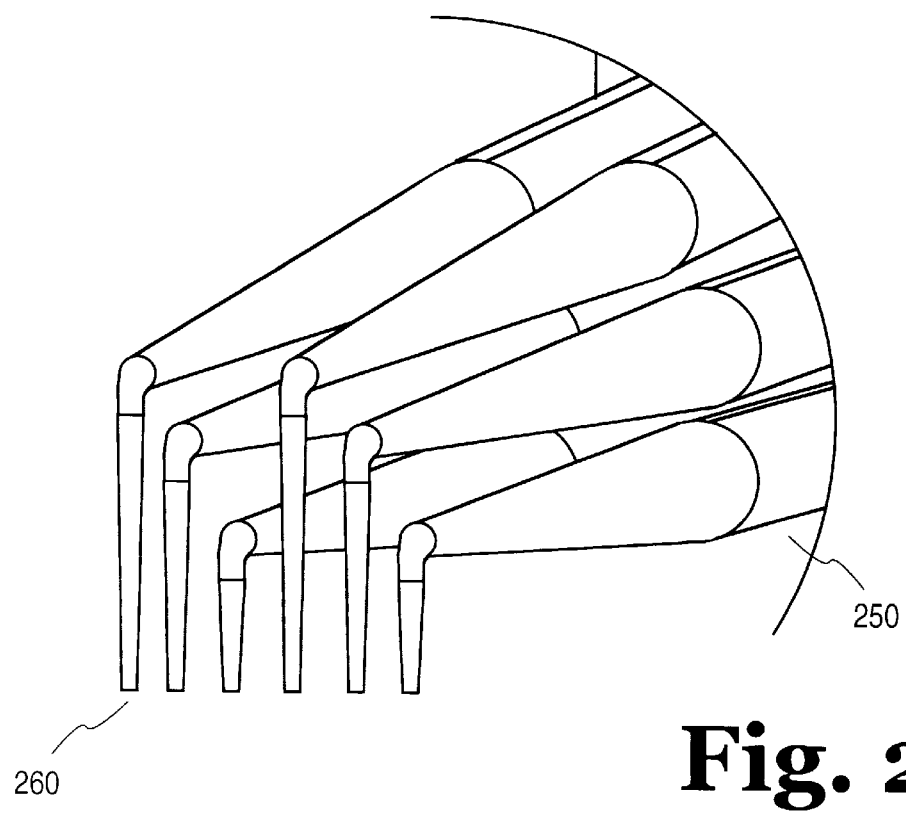
FIG. 24 is an expanded view of a portion of the beam assembly of FIG. 23 showing the probe features in accordance with an embodiment of the invention.

FIG. 23 shows an exploded perspective view of a portion of a beam assembly made up of a probe assembly 220, e.g., epoxy ring, having a plurality of layered probes 250 extending from probe assembly 220. FIG. 24 is an expanded view of a portion of FIG. 23 showing probes 250 having probe tips or features 260 arranged according to the invention with individually optimized beam lengths for each layer and individually optimized beam angles for each layer.

The mechanical geometries of the probe card design with respect to this embodiment of the invention allow a tighter distribution of contact force, uniform mechanical contact pressure, and better matched scrub lengths between probe layers when the probe tip engages the bond pad as compared to prior art devices. In multilayer probe card geometry, the lengths of the scrub is a function of the overtravel and of the probe needle geometry. Tip length is among the key factors in the determination of scrub lengths, which is governed by the flexure of the tip along its length during overtravel. By varying the beam angle by layer, the complementing tip lengths on the upper layer probes can be minimized, thus lowering the total variation in scrub length by layer.

The more uniform mechanical stresses between probe layers reduces or eliminates the need for periodic tweaking or positional adjustment of the probe feature position during the life of the probe card, thus facilitating greater availability for testing procedures. The design also provides more consistent overtravel than prior art probe card devices. One reason is that the tip lengths of the embodiment described herein is more tightly distributed (i.e., 18, 13, and 8 mils) for each layer as compared to the tip lengths of a prior art probe card (i.e., 25, 18, and 8 mils). The tighter distribution of tip lengths allows better scrubbing and better contact with the bond pad than prior art devices.

The invention also allows for a reduced mutual inductance in the probe assembly between the power/signal probes and their complementing ground probe. This is accomplished by the reduced clearances between layers along the tapered portion of the probe beam in the area adjacent to the probe band and is unique to the varying beam design of the invention. In this case, the mutual inductance is described by the following equation:

$$L=(\mu_0/4\pi)(1+2\ Ln(b^2/a^2))$$

where "b" is the separation of the complementing pair of probes and "a" is the diameter of the transmission line (i.e., probe). Since inductance is further measured by the length of the probe (from circuitry to probe tip), additional reduction in inductive noise in the probes is accomplished through incremental decreases and the total line lengths ($L_{TOTAL}$) illustrated in FIG. 20.

Combining the probe card design of the invention with the method for exposing the bond pad, the invention provides the highest degree of probe card life extension through minimized mechanical/abrasive cleaning while maintaining low nominal and maximum probe to bond pad contact resistance. The nominal probe to bond pad contact resistance can be maintained and repeated at a below one ohm standard to allow consistent, repeatable testing of integrated circuit devices, thus allowing a higher degree of re-sort repeatability using gross die bin results over the prior art and minimizing bin switching.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of exposing a bond pad of an integrated circuit, comprising:
   providing an integrated circuit having a bond pad, a first passivation layer overlying an area portion of said bond pad, and a second passivation layer overlying said first passivation layer;
   removing a portion of said second passivation layer to expose an area of said first passivation layer above said area portion of said bond pad;
   after removing a portion of said second passivation layer, curing said second passivation layer; and
   after curing, etching a portion of said exposed area of said first passivation layer to expose said top surface of said bond pad.

2. The method of claim 1, wherein said first passivation layer is a silicon nitride layer.

3. The method of claim 1, further comprising cleaning said exposed surface of said bond pad with a sputter etch.

4. The method of claim 1, wherein said second passivation layer is a polyimide layer.

5. The method of claim 1, wherein said second passivation layer is a photodefineable polyimide layer, said removing a portion of said second passivation layer comprising photodeveloping said second passivation layer to expose an area of said first passivation layer above a portion of said top surface of said bond pad.

6. The method of claim 1, wherein said integrated circuit has a pad pitch of less than 80 microns.

7. A method of coupling an integrated circuit chip to a chip package comprising:
   providing an integrated circuit having a bond pad, a first passivation layer overlying a top surface of said bond pad, and a second passivation layer overlying said first passivation layer;
   exposing an area portion of said top surface of said bond pad of said integrated circuit, by
   a) removing a portion of said second passivation layer above said area portion of said bond pad;
   b) after removing a portion of said second passivation layers curing said second passivation layer; and
   c) after curing, etching a portion of said exposed area of said first passivation layer to expose said area portion of said bond pad; and
   coupling said integrated circuit to a chip package through said bond pad.

8. The method of claim 7, after exposing said area portion of said bond pad, further comprising the step of cleaning said exposed area portion of said bond pad with a sputter etch.

9. The method of claim 7, wherein said second passivation layer is a polyimide layer.

10. The method of claim 7, wherein said second passivation layer is a photodefineable polyimide layer, said removing a portion of said second passivation layer comprising photodeveloping said second passivation layer to expose an area of said first passivation layer above a portion of said top surface of said bond pad.

11. The method of claim 7, further comprising coupling said integrated chip to said chip package by a solder bump process.

12. A method of probing the bond pads of an integrated circuit, comprising:
   exposing an area portion of adjacent bond pads of an integrated circuit, said adjacent bond pads having a pad pitch less than 80 microns; and
   probing said adjacent bond pads with a probe card,
   wherein said integrated circuit has a first passivation layer overlying said area portion of each of said bond pads, and a second passivation layer overlying said first passivation layer, and exposing an area portion of adjacent bond pads comprises:
      removing a portion of said second passivation layer to expose an area of said first passivation layer above a portion of said area portion of each of said pads;
      after removing a portion of said second passivation layer, curing said second passivation layer; and
      after curing, etching a portion of said exposed area of said first passivation layer to expose said top surface of said bond pad.

13. The method of claim 12, wherein said exposing an area portion of each of said adjacent bond pads further comprises said step of cleaning said exposed surface of said bond pad with a sputter etch.

14. The method of claim 12, wherein said second passivation layer is a polyimide.

15. The method of claim 12, wherein said second passivation layer is a polyimide, said removing a portion of said second passivation layer comprising photodeveloping a portion of said polyimide.

\* \* \* \* \*